(12) United States Patent
Fang et al.

(10) Patent No.: US 8,441,041 B2
(45) Date of Patent: May 14, 2013

(54) MEMORY DEVICE PERIPHERAL INTERCONNECTS

(75) Inventors: Shenqing Fang, Fremont, CA (US); Wenmei Li, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 29 days.

(21) Appl. No.: 12/943,679

(22) Filed: Nov. 10, 2010

(65) Prior Publication Data

US 2011/0057315 A1 Mar. 10, 2011

Related U.S. Application Data

(60) Division of application No. 12/512,960, filed on Jul. 30, 2009, now Pat. No. 7,951,704, which is a continuation-in-part of application No. 12/116,200, filed on May 6, 2008.

(51) Int. Cl.
*H01L 23/48* (2006.01)
(52) U.S. Cl.
USPC ............................................... 257/211
(58) Field of Classification Search ............... 257/211
See application file for complete search history.

(56) References Cited

U.S. PATENT DOCUMENTS

| | | | |
|---|---|---|---|
| 5,289,423 A | 2/1994 | Natale et al. | |
| 5,680,364 A | 10/1997 | Lee | |
| 5,885,856 A | 3/1999 | Gilbert et al. | |
| 6,225,697 B1 * | 5/2001 | Iguchi | 257/758 |
| 6,295,222 B2 | 9/2001 | Higashide et al. | |
| 6,399,897 B1 | 6/2002 | Umematsu et al. | |
| 6,468,894 B1 | 10/2002 | Yang et al. | |
| 6,486,558 B2 | 11/2002 | Sugiyama et al. | |
| 6,744,096 B2 | 6/2004 | Lee et al. | |
| 6,768,151 B2 * | 7/2004 | Kasai | 257/295 |
| 7,211,897 B2 * | 5/2007 | Yamanoue et al. | 257/758 |
| 7,224,069 B2 * | 5/2007 | Chen | 257/774 |
| 7,400,028 B2 | 7/2008 | Tomita | |
| 7,433,231 B2 | 10/2008 | Aritome | |
| 2004/0147128 A1 | 7/2004 | Yui et al. | |
| 2005/0035457 A1 | 2/2005 | Tomita et al. | |
| 2005/0110146 A1 | 5/2005 | Wang | |
| 2005/0121788 A1 | 6/2005 | Watanabe et al. | |
| 2006/0022224 A1 | 2/2006 | Hiroi | |
| 2006/0214218 A1 | 9/2006 | Shishido et al. | |
| 2006/0278918 A1 | 12/2006 | Inoue | |
| 2007/0123009 A1 | 5/2007 | Richter et al. | |
| 2007/0138536 A1 | 6/2007 | Arai et al. | |
| 2007/0262454 A1 | 11/2007 | Shibata | |
| 2008/0079091 A1 | 4/2008 | Park et al. | |
| 2008/0211109 A1 | 9/2008 | Kumagai | |
| 2009/0034323 A1 | 2/2009 | Lung et al. | |
| 2009/0035907 A1 | 2/2009 | Ikeda | |

* cited by examiner

*Primary Examiner* — Matthew W Such
*Assistant Examiner* — Robert Carpenter

(57) ABSTRACT

An integrated circuit memory device, in one embodiment, includes a substrate and first and second inter-level dielectric layers successively disposed on the substrate. One or more contacts in the peripheral extend through the first inter-level dielectric layer to respective components. One or more vias and a plurality of dummy vias extend through the second inter-level dielectric layer in the peripheral area. Each of the one or more peripheral vias extend to a respective peripheral contact. The peripheral dummy vias are located proximate the peripheral vias.

11 Claims, 23 Drawing Sheets

MEMORY DEVICE PERIPHERAL INTERCONNECTS

CROSS-REFERENCE TO RELATED APPLICATIONS

This is a divisional of U.S. patent application Ser. No. 12/512,960 filed Jul. 20, 2009, which is a continuation-in-part of U.S. patent application Ser. No. 12/116,200 filed May 6, 2008, both of which are incorporated herein by reference.

BACKGROUND OF THE INVENTION

The need for larger storage capacity devices, faster operating devices and/or lower power consuming devices continually drive further scaling of memory devices. However, the scaling of memory devices is constrained by design rules that are technology specific. The design rules specify the minimum feature sizes, spacings and overlaps for the component devices and interconnects, and the maximum misalignment that can occur between two masks. In addition, line width expansion and shrinkage throughout fabrication also strongly affect the design rules.

Referring to FIG. 1, an integrated circuit (IC) memory device, according to the conventional art, is shown. The IC includes a core area 110 that includes the memory cell array of the device. The IC also includes a peripheral area that may include one or more circuits such as write buffer, read buffer, data latch, address latch, address decoder and control logic. The core area is characterized by a very high circuit density and therefore the structures are fabricated with minimum feature sizes. The peripheral area may have circuits with lower densities and therefore may or may not be fabricated with minimum feature sizes. However, it is desirable to fabricate the structures in the core area using as many of the same fabrication processes as possible.

Referring now to FIGS. 2A and 2B, a top and side view representation of an exemplary portion of a peripheral structure, according to the conventional art, is shown. The exemplary peripheral structure includes a plurality of transistor structures 210 and interconnecting structures 215-225. The interconnect structures in the peripheral area may include a contact 215 coupled to the transistor 210, a via 220 coupled to the contact 215, and a plurality of lines 225 (e.g., word, bit, address, data, control or the like), wherein one of the lines 225 is coupled to the via 220.

In order to continue to scale memory devices, such as NAND flash memories, there is a continuing need to further scale the interconnects. Preferably, the interconnects should be fabricated using as few masks as possible. The resistance of interconnects should also preferably be lower than conventional interconnects. Furthermore, differences between the structures in the peripheral area and the structures in the core area should not deleteriously impact the scaling of the structures.

SUMMARY OF THE INVENTION

Embodiments of the present technology are directed toward integrated circuit (IC) memory devices. In one embodiment, the integrated circuit memory device includes a substrate having a peripheral area and a core area. A first inter-level dielectric layer is disposed on the substrate and a second inter-level dielectric layer is disposed on the first inter-level dielectric layer. A peripheral contact extends through the first inter-level dielectric layer in the peripheral area. A peripheral via extends through the second inter-level dielectric layer to the peripheral contact in the peripheral area. In addition, a plurality of peripheral dummy vias, adjacent the peripheral via, extend through the second inter-level dielectric layer in the peripheral area. The peripheral via is coupled to a first metallization layer.

In another embodiment, a method of fabricating the integrated circuit memory device includes depositing a first inter-level dielectric layer on a substrate. One or more contact openings, that extend to respective components in the peripheral area of the substrate, are etched in the first inter-level dielectric layer. Contacts, in the peripheral area, are formed in the contact openings. A second inter-level dielectric layer is deposited on the first inter-level dielectric layer. One or more via openings, that extend to respective contacts in the peripheral area, are etched in the second inter-level dielectric layer. A plurality of dummy via openings are also etched in the second inter-level dielectric layer proximate the via openings. Peripheral vias are formed in the via openings and peripheral dummy vias are formed in the dummy via openings.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Integrated circuits such as memory devices may have hundreds, thousands, millions or more transistors, capacitors and the like, referred herein to as semiconductor components, fabricated therein. The interconnections between semiconductor components are typically made in a plurality of levels. As used here, the term "line" and "lines" refer to the portions of interconnects that are arranged in planes that are substantially parallel to the wafer substrate. For example, a memory device typically includes a plurality of source lines, bit lines, drain select gates, source select gates, and the like fabricated in one or more planes in the interconnect layers. The terms "contact," "contacts," "via" and "vias" refer to the portions of interconnects that are substantially perpendicular to the wafer substrate used to connect lines in different planes or provide a connection at the surface of the die to lines or components buried under one or more layers.

Embodiments of the present technology are directed to fabrication of contacts and vias in the peripheral area in IC memory devices. In addition, various peripheral area contacts may be enlarged and isolated with insubstantial orientation limitations. Various peripheral area vias may also be fabricated with dummy vias to improve manufacturability. In addition, the various peripheral contacts and vias may be formed at the same time as corresponding structures in the core area. Furthermore, the various peripheral area contacts and vias may be metal.

Figure 1:
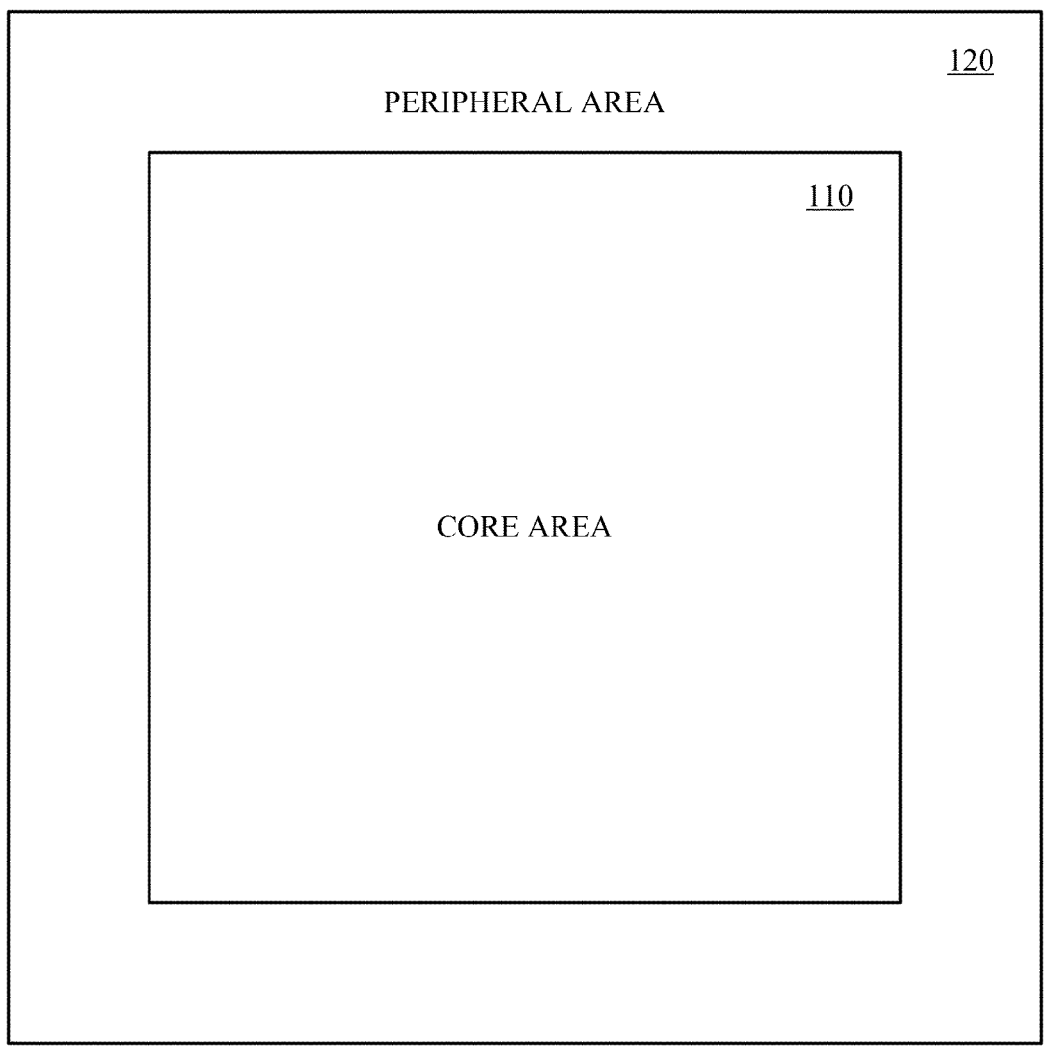
FIG. 1 shows integrated circuit (IC) memory device, according to the conventional art.
Figure 2A:
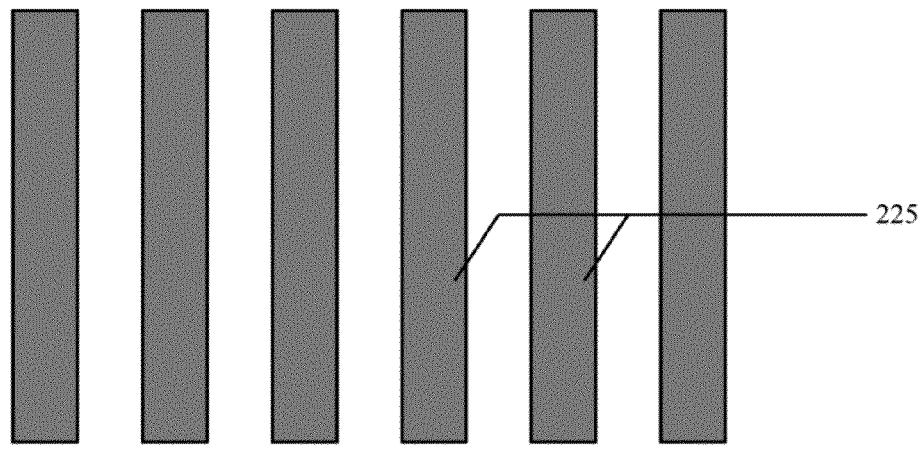
FIGS. 2A and 2B show an exemplary portion of a peripheral structure, according to the conventional art.
Figure 2B:
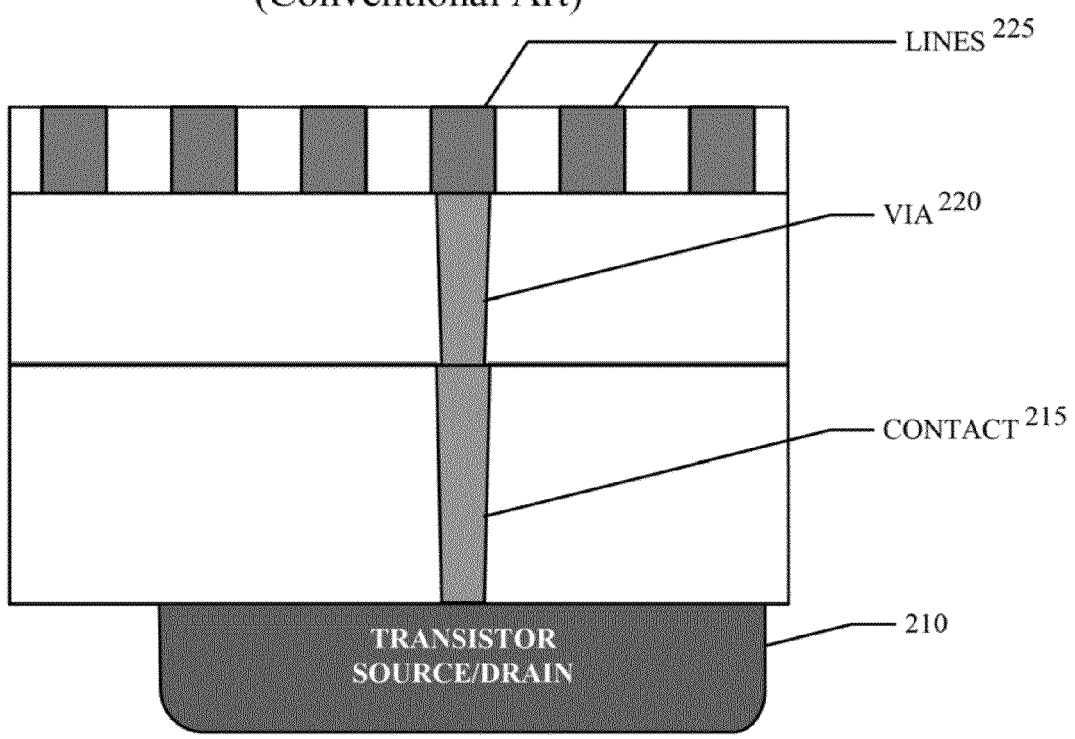
Figure 3A:
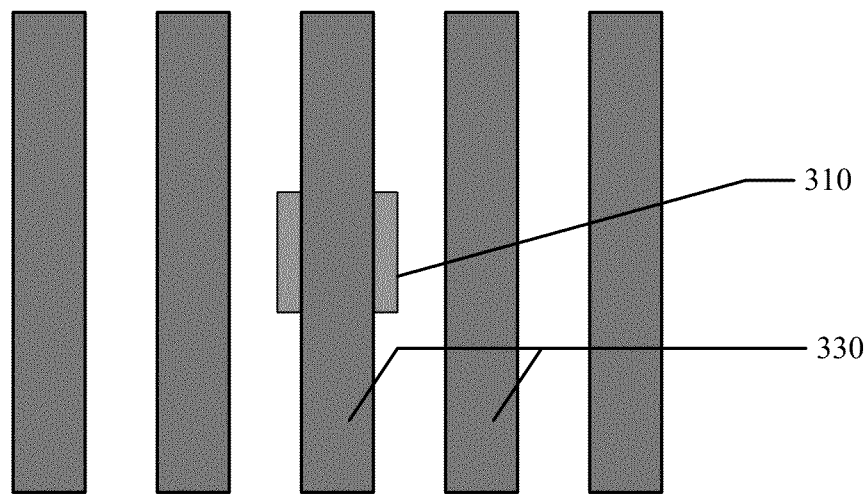
FIGS. 3A and 3B show an exemplary portion of a peripheral structure, in accordance with one embodiment of the present technology.
Figure 3B:
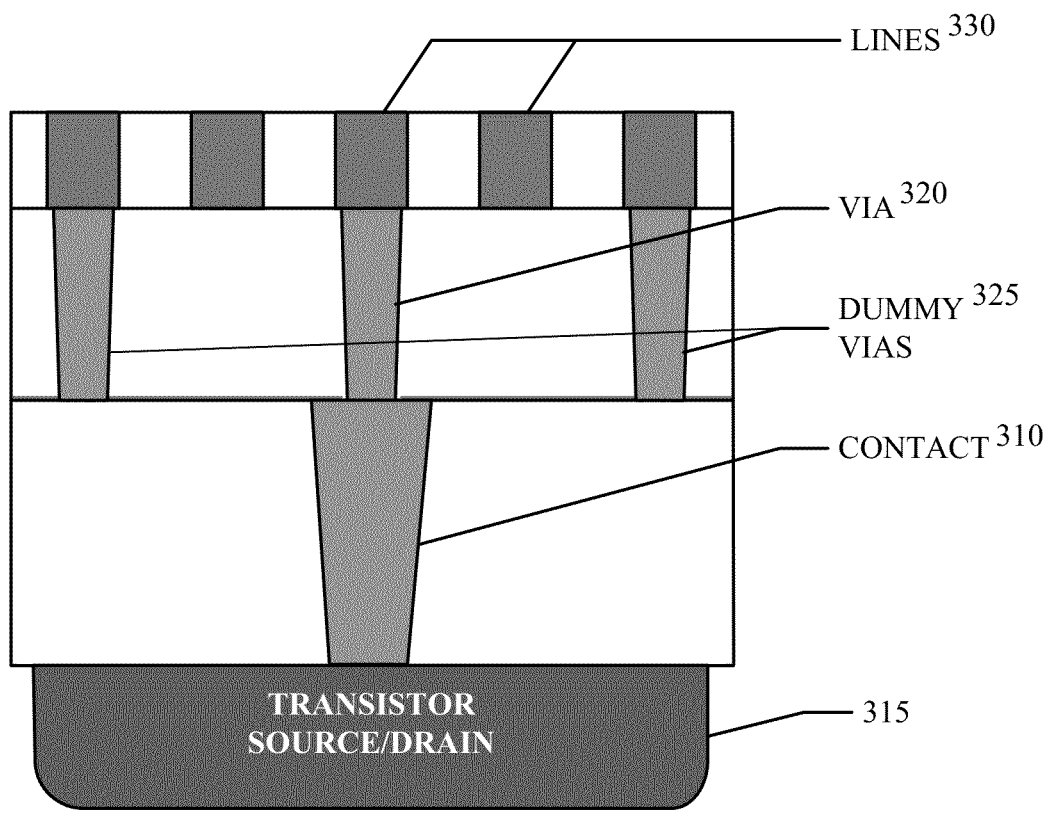

Referring now to FIGS. 3A and 3B, a top and side view representation of an exemplary portion of a peripheral structure, in accordance with one embodiment of the present technology, is shown. The various structures in the peripheral area may include components, such as transistors, and one or more interconnects. Such interconnect structures in the peripheral area may include one or more contacts 310 coupled to a component such as a transistor 315, a via 320 coupled to each contact 310, one or more dummy vias 325, and a plurality of lines 330. At least one of the lines 330 is coupled to a via 320. One or more of the other lines 330 may each be coupled to a dummy via 325.

The contact 310 in the peripheral area that are coupled between a component and a line, as described above, may be enlarged with respect to corresponding conventional contacts. The enlarged contacts can be isolated with little or no orientation limitation because the component structure density is generally less dense than the in the core area and therefore there is more space. The enlarged contacts enable improved registration between the contacts 310 and the vias 320, and therefore increase the alignment tolerances there between. In addition, the dummy vias 325 improve the manufacturability of the vias 320 in the peripheral area. In particular, the vias 320 may be fabricated with a minimum pitch concurrently with the fabrication of other vias, such as core area vias. However, the interconnects in the peripheral region typically have a lower density as compare to similar interconnects in the core area. The feature size of the vias 320 in the peripheral area in combination with relatively large spacing there between limits the actual minimum feature size that can be achieved in conventional devices. Therefore, the dummy vias 325 are added to increase the density and therefore reduce the spacing between vias. The denser pattern of vias 320 and dummy vias 325 enables a smaller actual minimum feature size (e.g., pitch) to be achieved than can be achieved without the dummy vias 325.

The contacts 310, vias 320 and dummy vias 325 in the peripheral area may be fabricated concurrently with the fabrication of similar structures in the core area. The above described interconnect structure may also be used in combination with other conventional interconnect structures in the peripheral area of the IC device.

Referring now to FIGS. 4A-4D, a method of fabricating interconnects in the peripheral area of an integrated circuit (IC) memory device, according to one embodiment of the present technology, is shown. The method of fabricating multilevel interconnects in the peripheral area of an IC memory device will be further illustrated with reference to FIGS. 5A-5D, which shows various stages during fabrication of the IC memory device. The method of fabricating the IC memory device begins, at 402, with various initial processes upon a wafer 502, such as cleaning, depositing, oxidation, doping, diffusion, implanting, photolithography, etching, chemical vapor deposition, evaporation, sputtering, epitaxy, annealing and/or the like. The initial fabrication processes form an array of memory cells, and periphery circuits such as input/output buffers, data latch, address latch, address decoders and control logic. In one implementation, the IC memory device may be a NAND flash memory device.

At 404, a first inter-level dielectric layer (ILD0A) 504 is deposited on the wafer 502. The inter-level dielectric may be chemical-vapor-deposited or sputtered silicon dioxide (SiO2), polyimide or the like. At 406, the inter-level dielectric layer 504 is thinned and/or planarized. In one implementation, the deposited first inter-level dielectric layer 504 is thinned and planarized by chemical-mechanical polishing (CMP). At 408, an anti-reflective coating (ARC) may also be deposited. At 410, a photo-resist is deposited and patterned by any well-known lithography process to form a peripheral contact mask. At 412, one or more peripheral contact openings 512 are etched by any well-known etching method. In one implementation, an etchant interacts with the portions of the first inter-level dielectric layer 504 exposed by the patterned resist until one or more contact openings 512 are formed proximate one or more semiconductor structures (e.g., source and/or drain) 513 in the peripheral area. The peripheral contact openings 512 may be enlarged and isolated with insubstantial orientation limitations because the density of structures is generally less in the peripheral area than in the core area. In addition, the aspect ratio of the peripheral contact openings 512 may be characterized by tapered walls. At 414, the peripheral contact mask is removed utilizing an appropriate resist stripper or a resist ashing process.

Figure 4A:
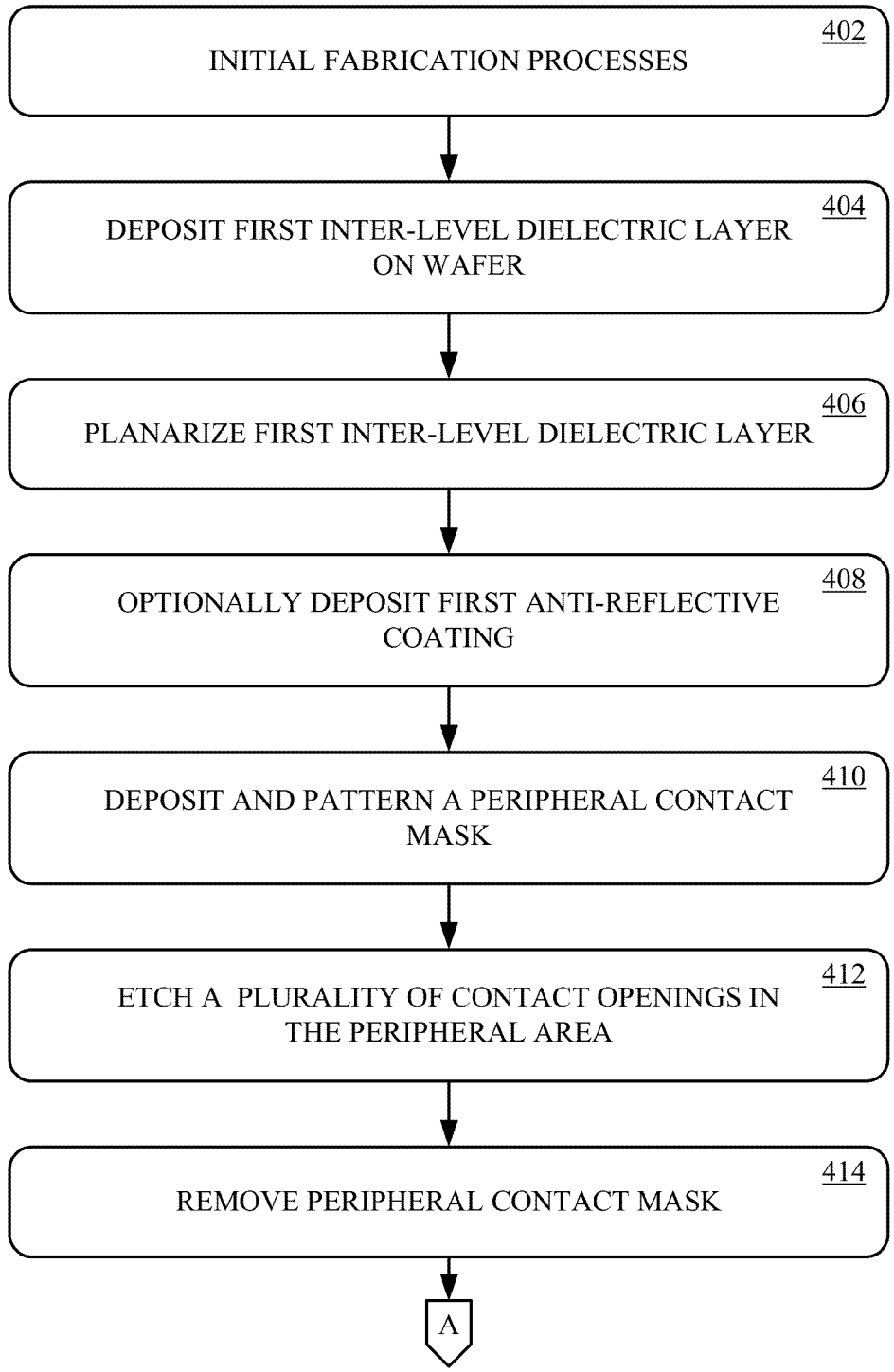
FIGS. 4A-4D shows a method of fabricating interconnects in the peripheral area of an integrated circuit (IC) memory device, according to one embodiment of the present technology.
Figure 4B:
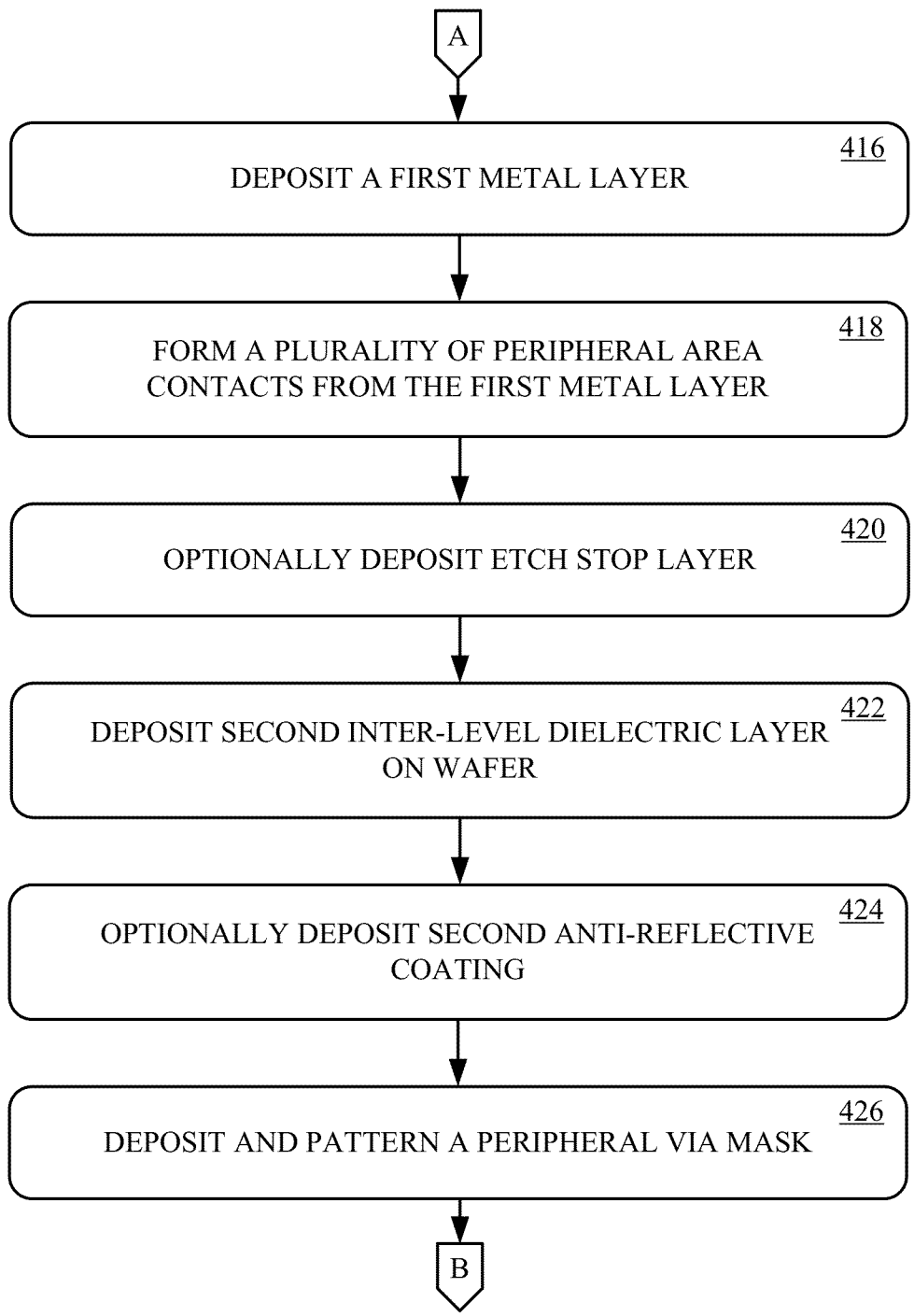
Figure 5A:
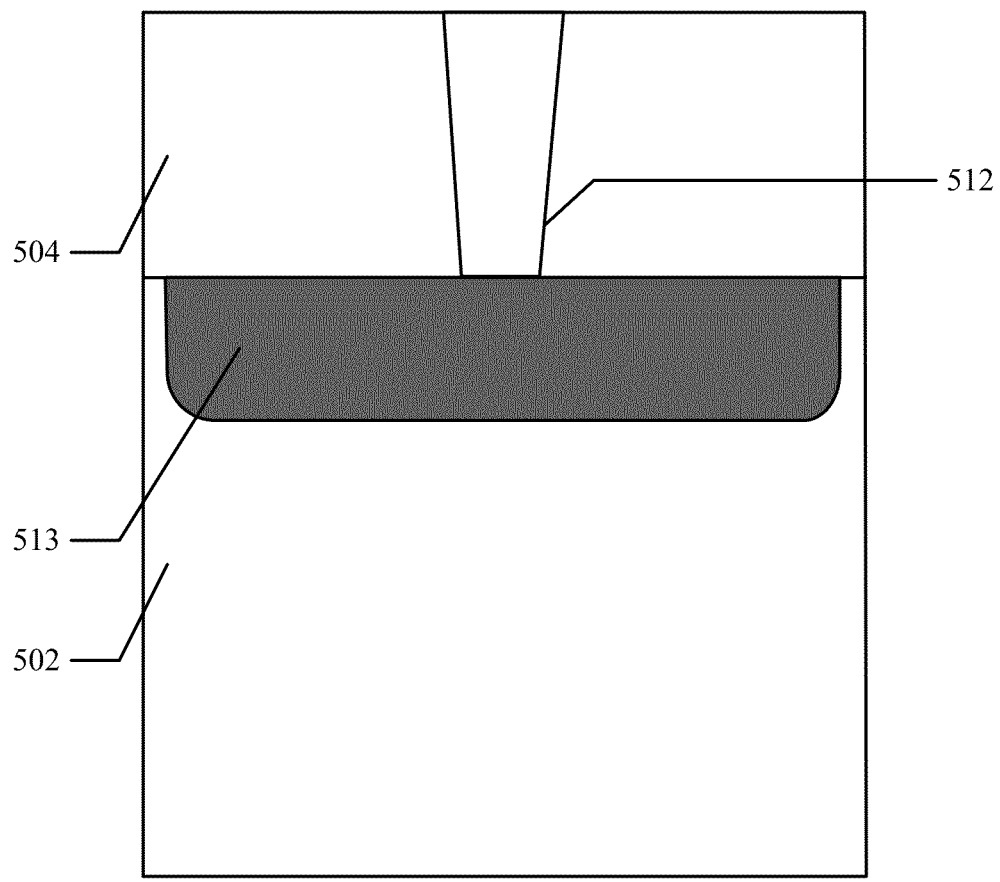
FIGS. 5A-5D shows various stages during fabrication of the IC memory device, in accordance with one embodiment of the present technology.
Figure 5B:
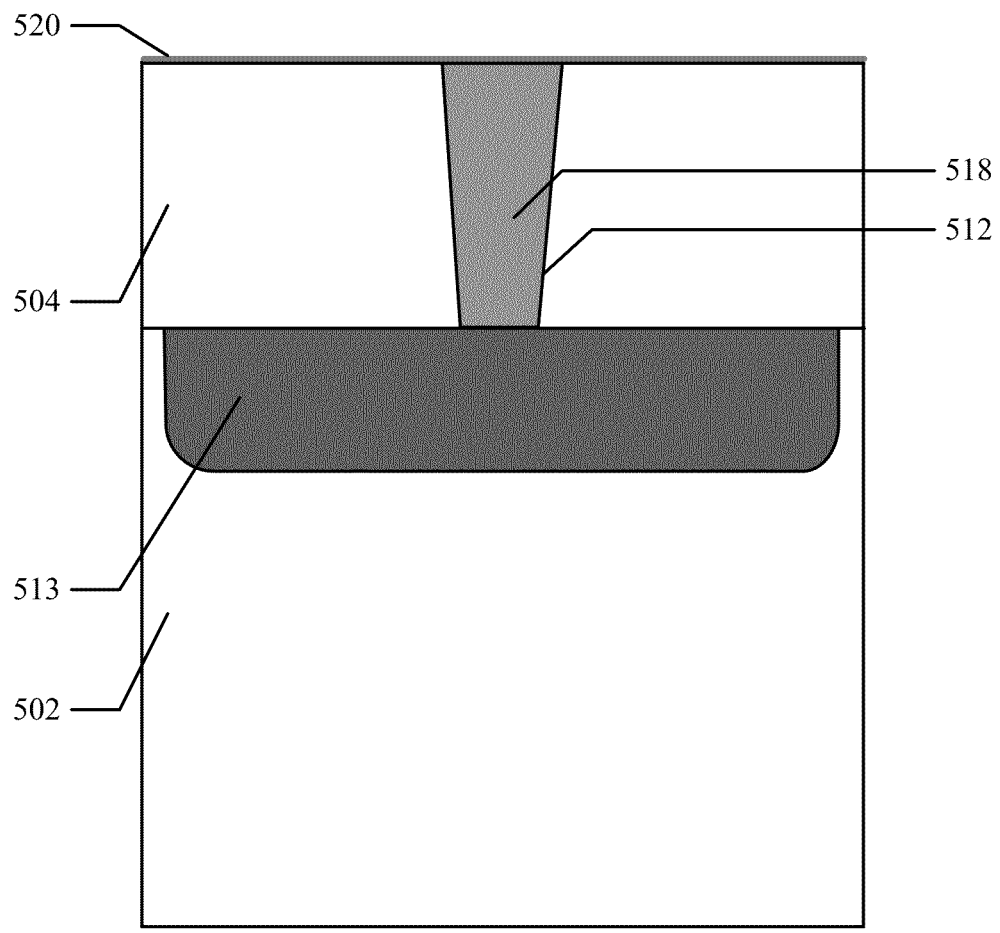

Referring now to FIGS. 4B and 5B, a first metal layer is deposited on the first inter-level dielectric 504, at 416. In one implementation, the metal may be titanium (Ti), titanium nitride (TiN), tungsten (W), or a multilayer metal such as Ti/TiN/W. At 418, excess metal of the first metal layer is removed to form one or more peripheral contacts 518 in the peripheral contact openings 512. In one implementation, the first metal layer is chemical-mechanical polished (CMP) to form the peripheral area contacts 518 in the contact openings 512. At 420, an etch stop layer (ESL) 520 may be deposited.

Figure 4C:
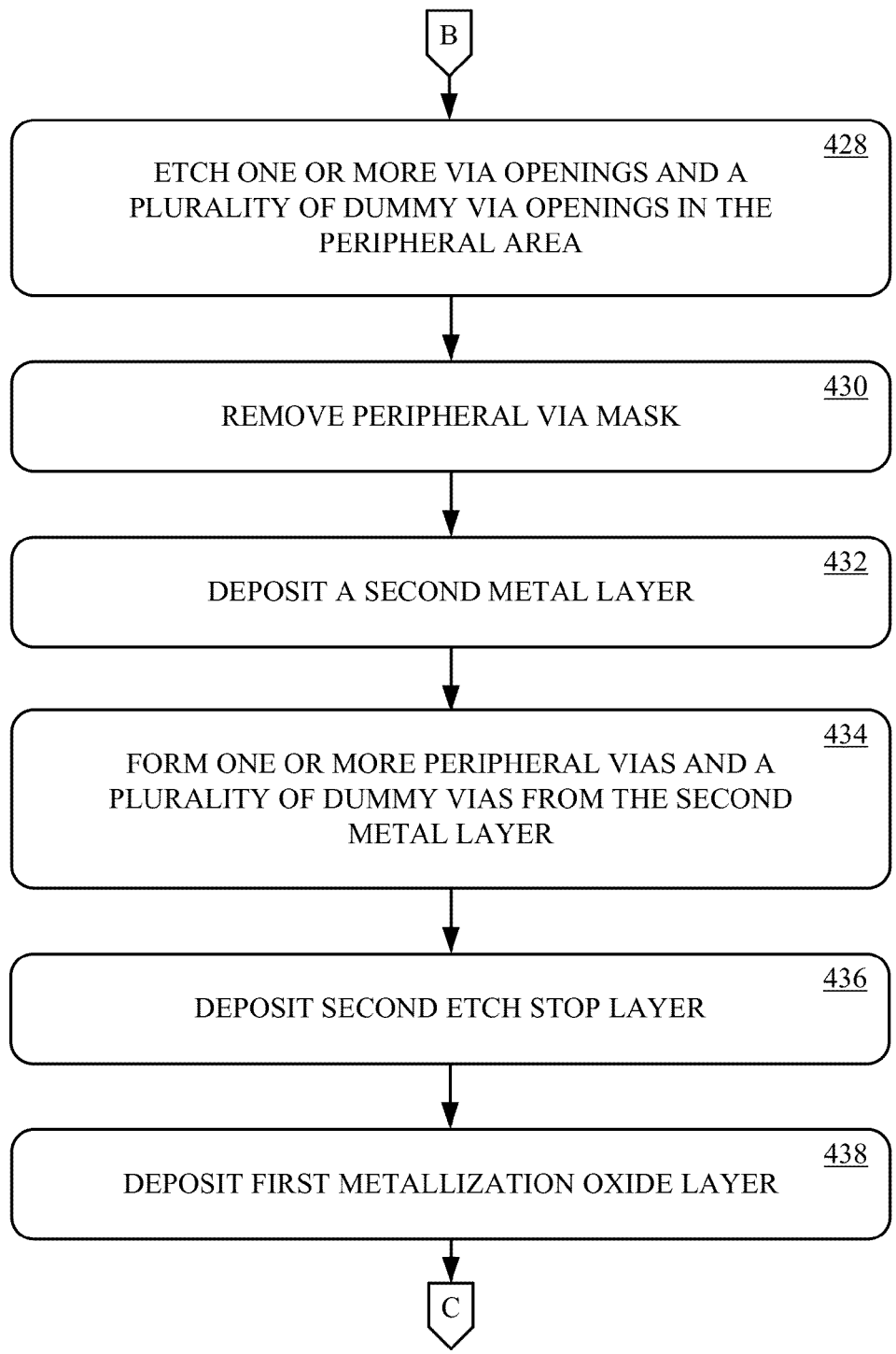
Figure 5C:
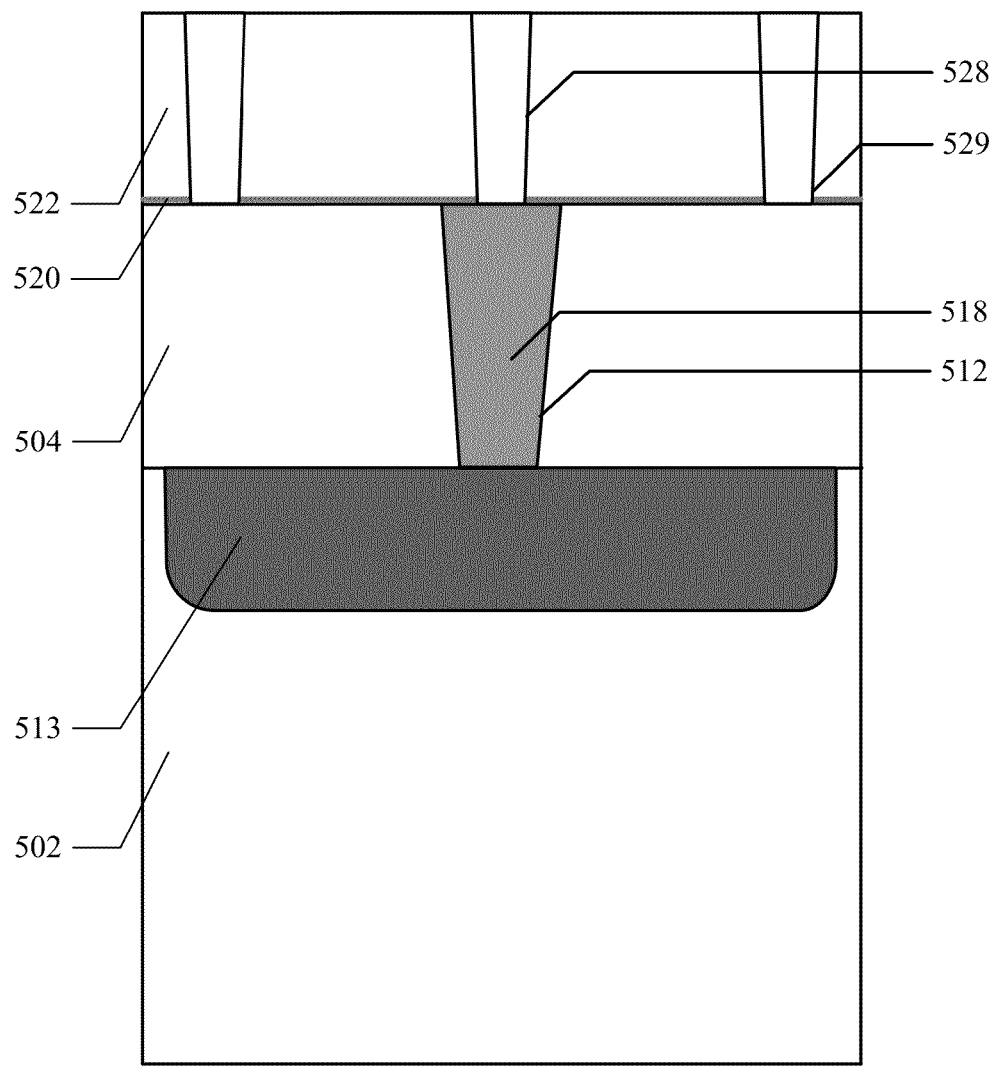

Referring now to FIG. 5C, a second inter-level dielectric layer (ILD0B) 522 is deposited, at 422. The inter-level dielectric may be chemical-vapor-deposited or sputtered silicon dioxide (SiO2), polyimide or the like. A second anti-reflective coating (ARC) may also be deposited, at 424. At 426, a photo-resist is deposited and patterned by any well-known lithography process to form a peripheral via mask. The pattern of the peripheral via mask includes one or more via openings in registration with the contacts 518 and one or more dummy via openings proximate the via openings. Referring now to FIG. 4C, a plurality of openings are etched in the peripheral area by any well-known etching method to form one or more peripheral via openings 528 and a plurality of peripheral dummy via openings 529, at 428. In one implementation, an etchant removes the portions of the second inter-level dielectric layer 522 exposed by the patterned resist layer until the one or more peripheral via openings 528 extend to respective contacts 518, and a plurality of peripheral dummy via openings 529 are formed proximate the one or more peripheral via openings 528. Again, the aspect ratio of the peripheral via openings 528 and peripheral dummy via openings 529 may be characterized by tapered walls. At 430, the peripheral via mask is removed utilizing an appropriate resist stripper or a resist ashing process.

Figure 5D:
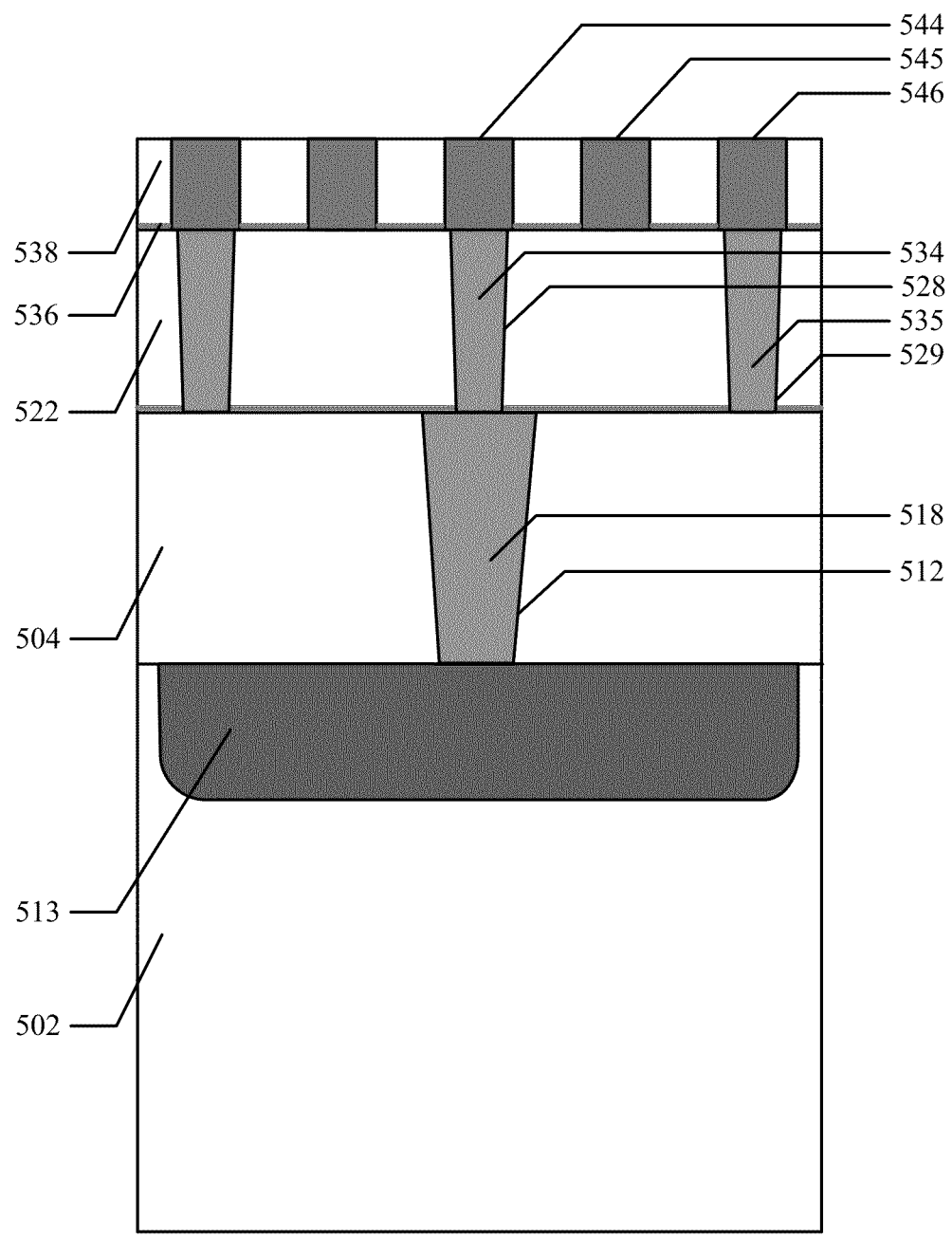

Referring now to FIG. 5D, a second metal layer is deposited on the second inter-level dielectric 522 and in the peripheral via and dummy via openings 528, 529, at 432. In one implementation, the metal may be titanium (Ti), titanium nitride (TiN), tungsten (W), or a multilayer metal such as Ti/TiN/W. At 434, excess metal is removed to form one or more peripheral vias 534 and a plurality of peripheral dummy vias 535. In one implementation, the second metal layer is chemical-mechanical polished (CMP) to form the peripheral vias 534 in the peripheral via openings 528 and the peripheral dummy vias 535 in the peripheral dummy via openings 529.

Figure 4D:
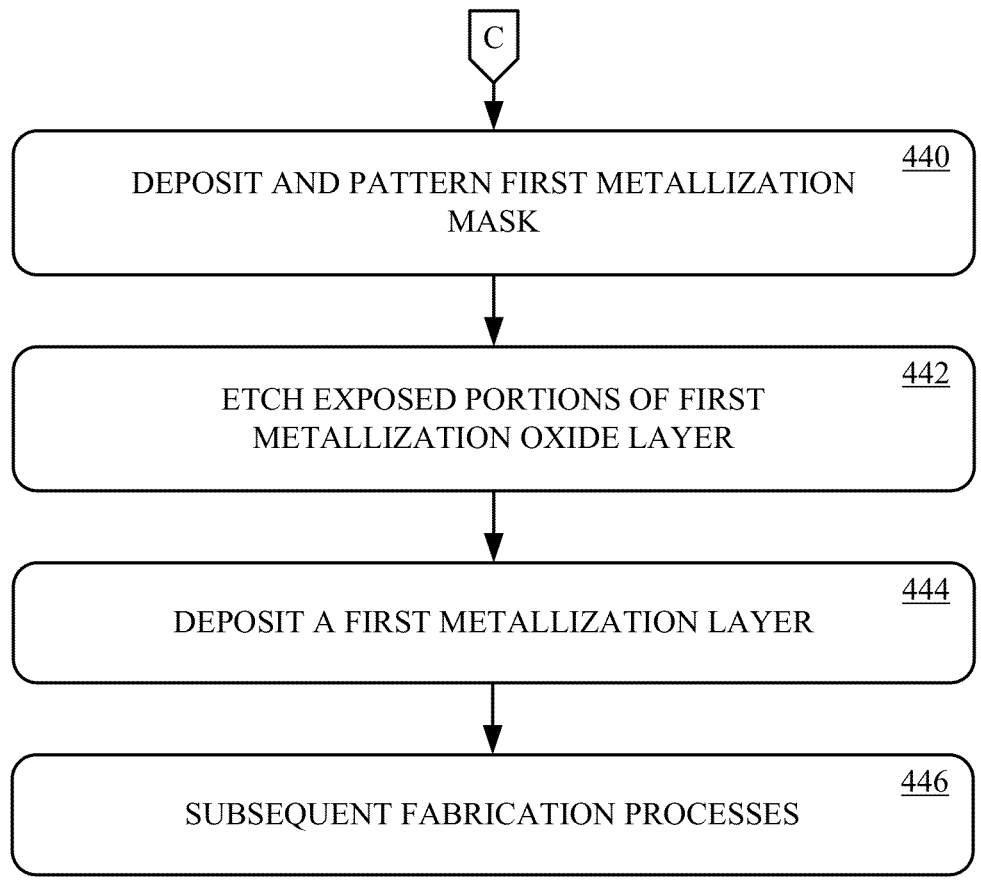

At 436, a second etch stop layer (ESL) 536 may be deposited. At 438, a first metallization oxide layer 538 is deposited. Referring now to FIG. 4D, a photo-resist is deposited and patterned by any well-known lithography process to form a first metallization layer mask, at 440. At 442, the exposed portions of the first metallization oxide layer 538 are etched by any well-known etching method. At 444, a third metal layer is deposited using an additive plating technique or the like to form first metallization layer 544, 545, 546. The first metallization layer may include at least one line 544 coupled to the at least one peripheral via 534, and one or more additional lines 545, 546 in the peripheral area. One or more of the additional lines 546 may be coupled to a respective one of the plurality of dummy vias 535 because the dummy vias 535 are not coupled to any other structures. In one implementation, the metal may be copper (Cu), aluminum (Al), tungsten (W) or the like. At 446, fabrication continues with various other processes. The various processes typically include cleaning, depositing, oxidation, doping, diffusion, implanting, photolithography, etching, chemical vapor deposition, evaporation, sputtering, epitaxy, annealing, passivation, cleaving and/or the like.

The above described method of fabricating interconnects in the peripheral area of an integrated circuit (IC) memory device may be combined with the method of fabricating interconnects in the core area described and illustrated with references to FIGS. 5A-5D and 6A-6D in U.S. patent application Ser. No. 12/116,200 filed May 6, 2008, which is incorporated herein by reference. The techniques are further described below with reference to another embodiment of fabricating the interconnects in the peripheral area and the core area, which related to the embodiment in FIGS. 7A-7D and 8A-8D in U.S. patent application Ser. No. 12/116,200 filed May 6, 2008.

Referring now to FIGS. 6A-6D, a method of fabricating interconnects in the peripheral area and the core area of an IC memory device, according to another embodiment of the present technology, is shown. The method of fabricating multilevel interconnects in the IC memory device will be further illustrated with reference to FIGS. 7A-7D, which show various stages during fabrication in the peripheral area, and FIGS. 8A-8D, which show various corresponding stages during fabrication in the core area of the IC memory device. The method of fabricating the IC memory device begins, at 602, with various initial processes upon a wafer 702, 802, such as cleaning, depositing, oxidation, doping, diffusion, implanting, photolithography, etching, chemical vapor deposition, evaporation, sputtering, epitaxy, annealing and/or the like. The initial fabrication processes form an array of memory cells, and periphery circuits such as input/output buffers, data latch, address latch, address decoders and control logic. In one implementation, the IC memory device may be a NAND flash memory device.

At 604, a first inter-level dielectric layer (ILD0A) 704, 804 is deposited on the wafer 702, 802. The inter-level dielectric may be chemical-vapor-deposited or sputtered silicon dioxide ($SiO_2$), polyimide or the like. At 606, the inter-level dielectric layer 704, 804 is thinned and/or planarized. In one implementation, the deposited first inter-level dielectric layer is thinned and planarized by chemical-mechanical polishing (CMP). At 608, a first anti-reflective coating (ARC) may also be deposited. At 610, a photo-resist is deposited and patterned by any well-known lithography process to form a peripheral contact and core area source line and staggered bit line contact mask. At 612, a plurality of openings are etched by any well-known etching method to form one or more contact openings 712 in the peripheral area and a plurality of source line trenches 812 and a plurality of staggered bit line contact openings 813 in the core area. In one implementation, an etchant interacts with the portions of the first inter-level dielectric layer 704 exposed by the patterned resist until one or more peripheral contact openings 712 are formed proximate one or more semiconductor structures (e.g., source and/or drain) 713 in the peripheral area. The etchant also removes the exposed portions of the first inter-level dielectric layer 804 until a plurality of source line trenches 812 are formed, and a plurality of staggered bit line contact openings 813 are formed that extend to one or more bit lines 815.

The peripheral contact openings 712 may be enlarged and isolated with insubstantial orientation limitations because the density of structures is generally less in the peripheral area than in the core area. The aspect ratio of the peripheral contact openings 712 may also be characterized by tapered walls. In addition, the bit line contact openings 813 in the core area are staggered so that adjacent openings are not in the same row. Furthermore, the aspect ratio of the staggered bit line contact openings 813 may also be characterized by tapered walls. The staggering of the bit line contact openings 813 in the core area enable use of a larger tapering for the bit line contact openings 713.

Figure 6A:
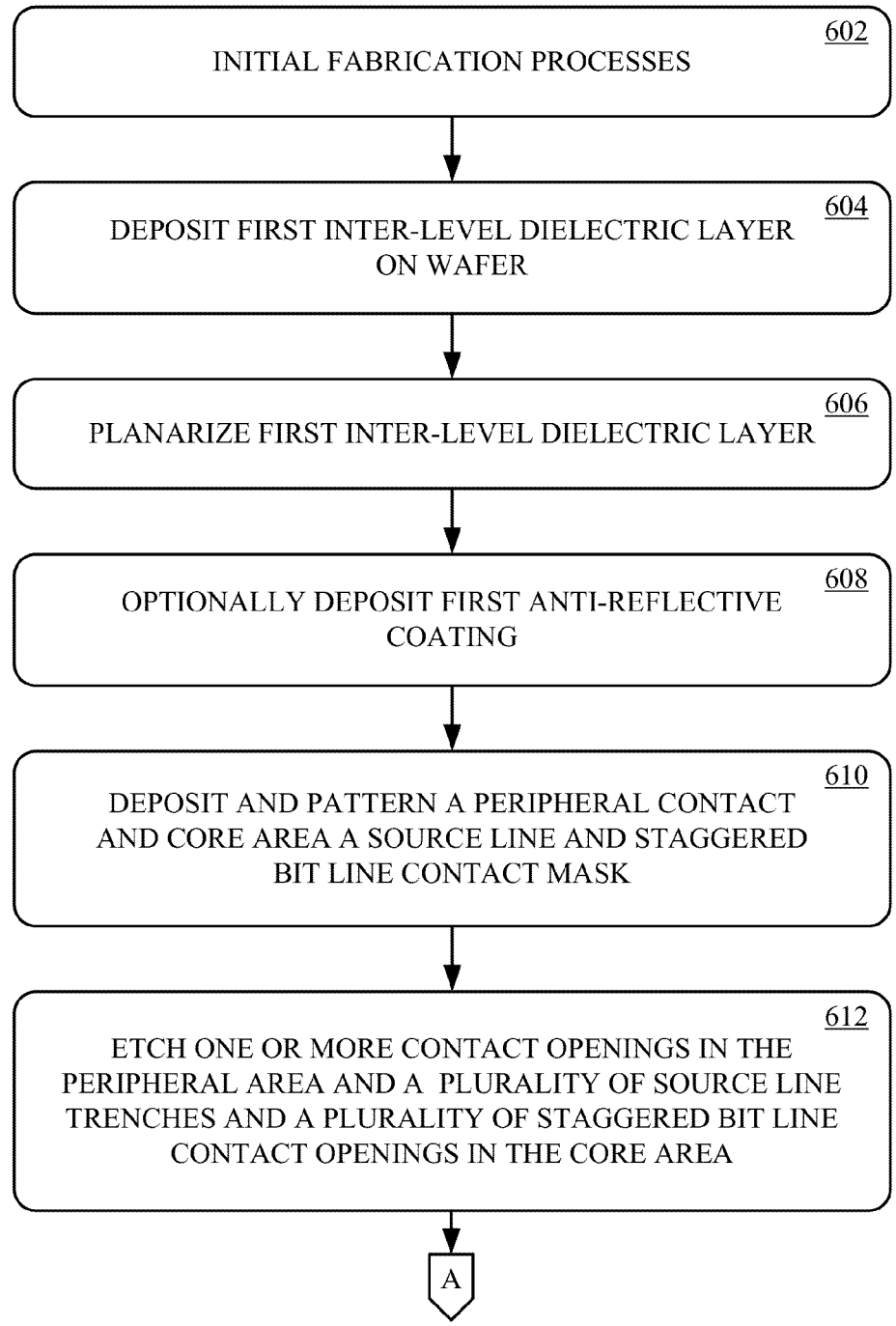
FIGS. 6A-6D show a method of fabricating interconnects in an integrated circuit (IC) memory device, according to another embodiment of the present technology.
Figure 6B:
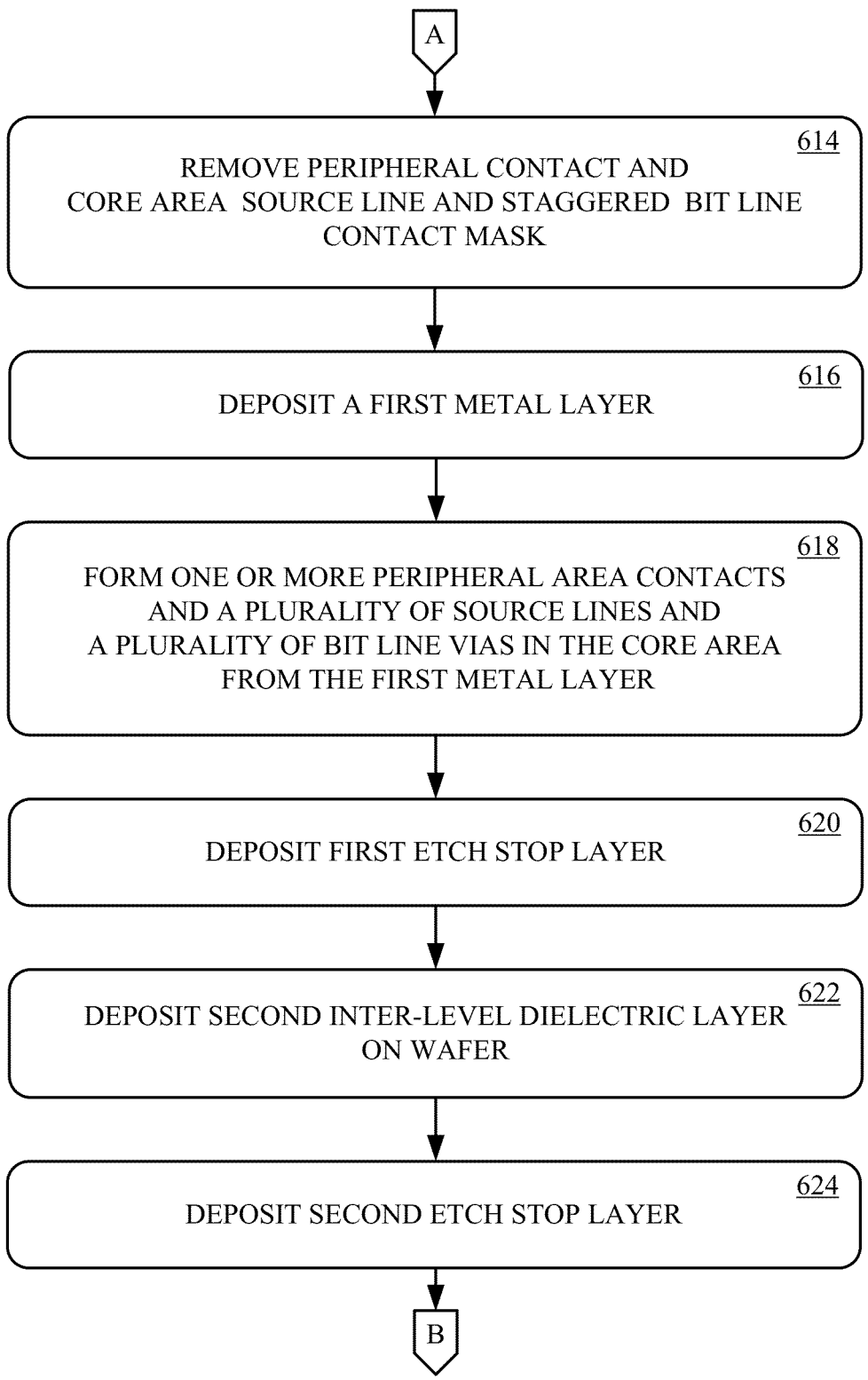
Figure 7A:
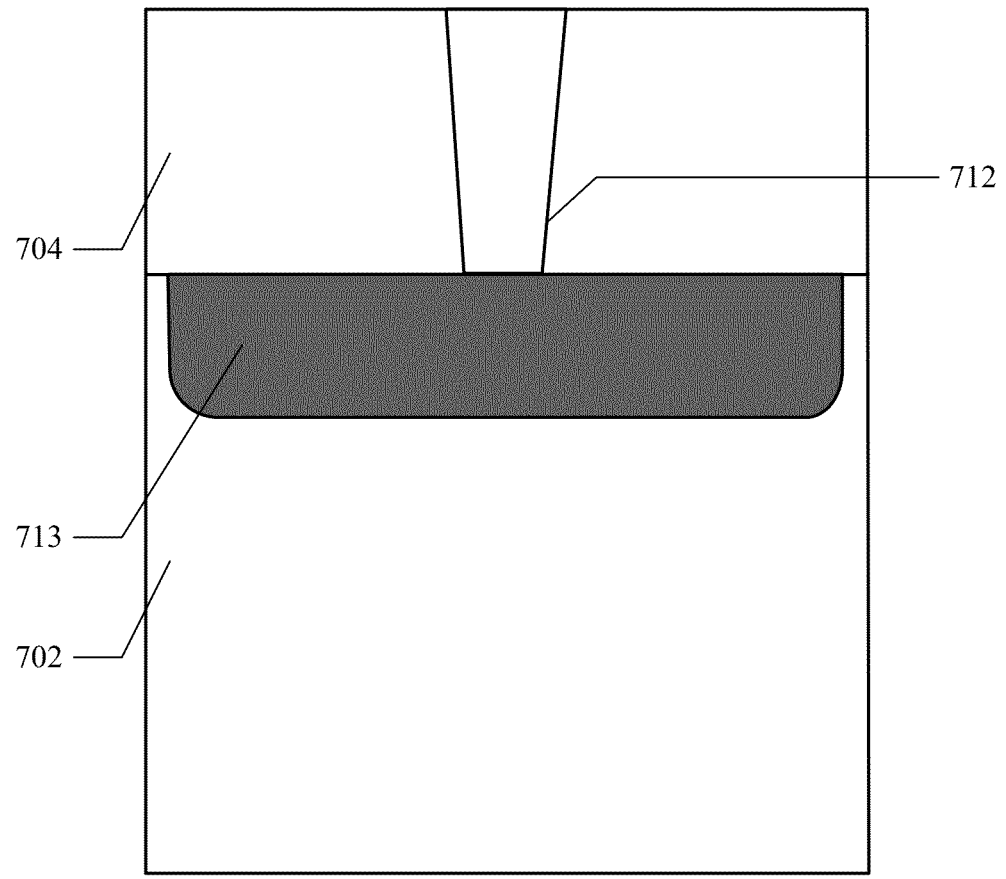
FIGS. 7A-7D shows various stages during fabrication of the IC memory device, in accordance with another embodiment of the present technology.
Figure 7B:
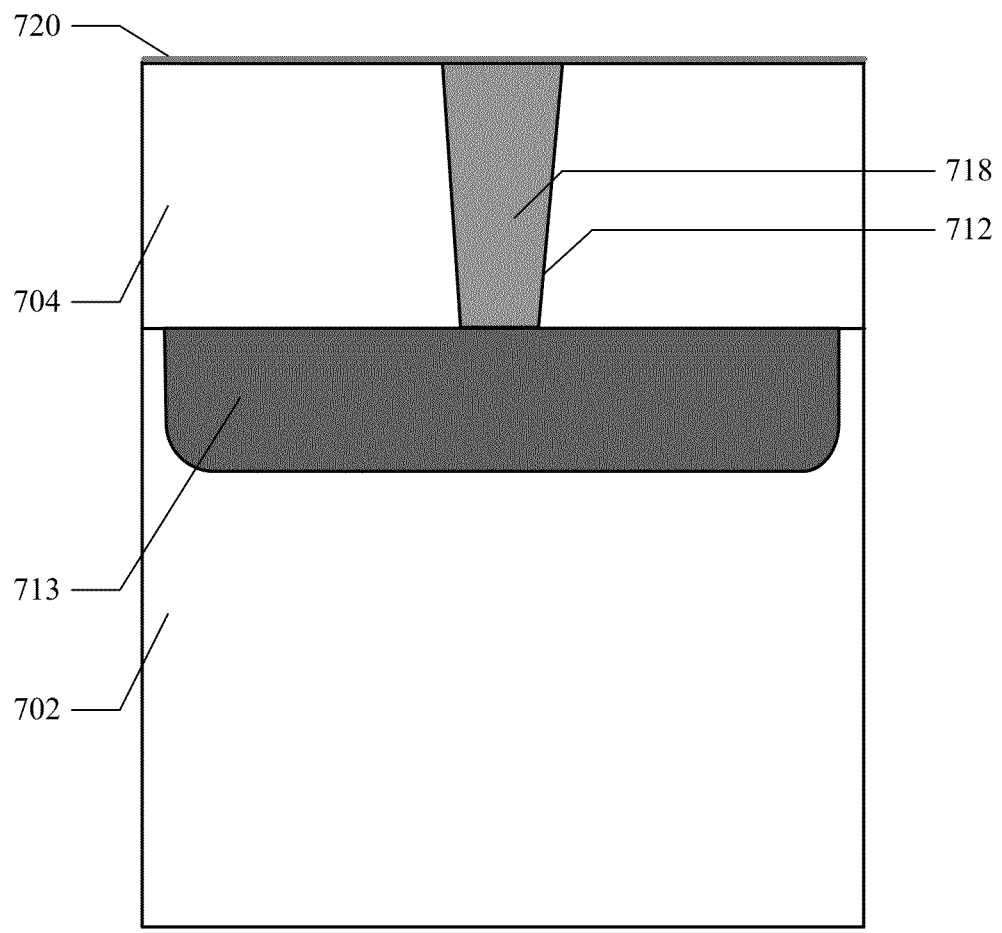
Figure 8A:
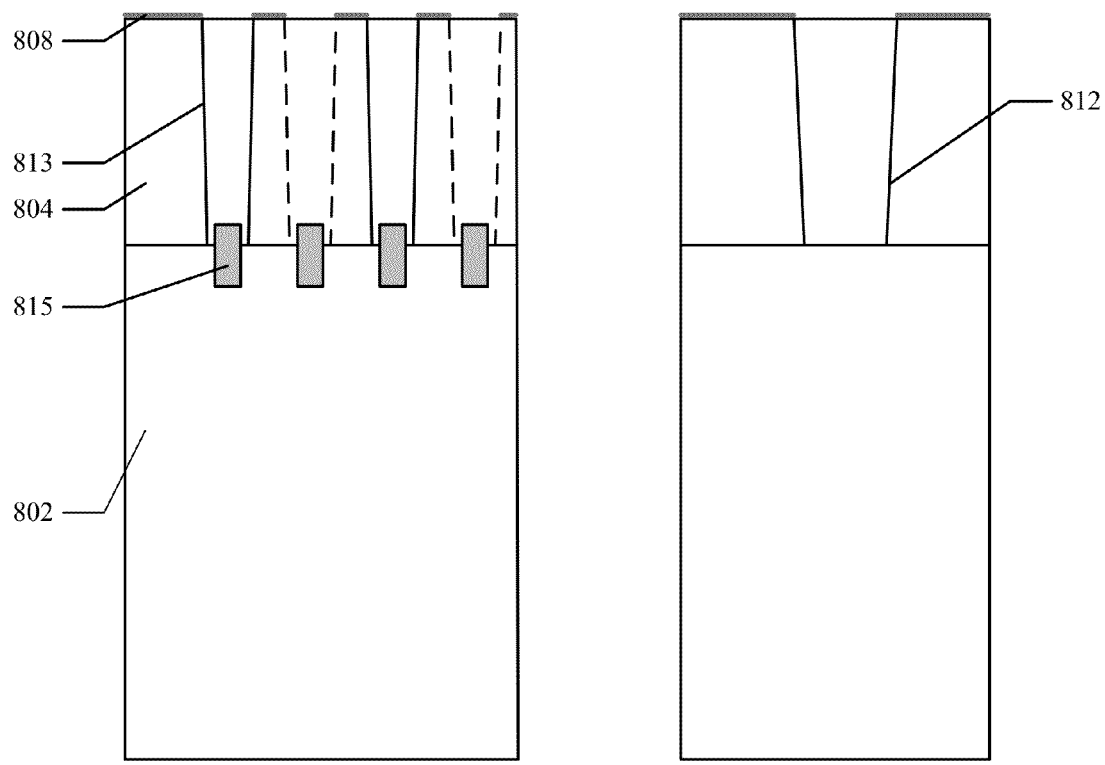
FIGS. 8A-8D shows various stages during fabrication of the IC memory device, in accordance with another embodiment of the present technology.
Figure 8B:
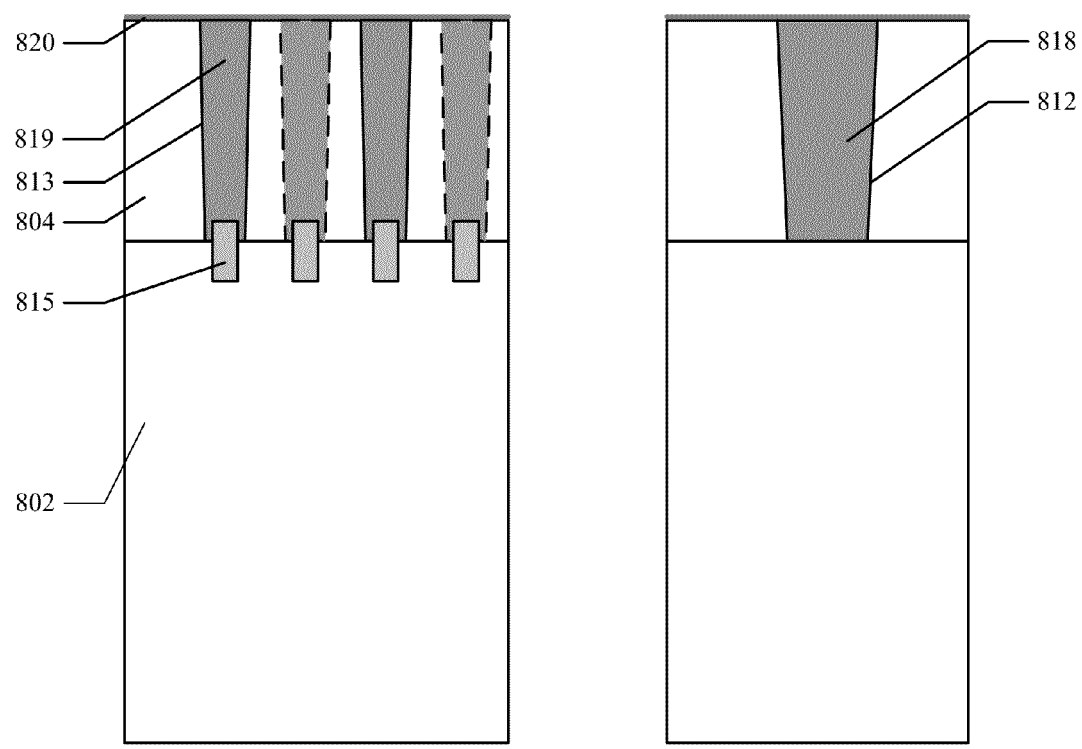

Referring now to FIG. 6B, the peripheral contact and core area source line and staggered bit line contact mask is removed utilizing an appropriate resist stripper or a resist ashing process, at 614. Referring now to FIGS. 7B and 8B, a first metal layer is deposited on the first inter-level dielectric 704, 804, at 616. In one implementation, the metal may be titanium (Ti), titanium nitride (TiN), tungsten (W), or a multilayer metal such as Ti/TiN/W. At 618, excess metal of the first metal layer is removed to form one or more peripheral contacts 718 in the peripheral contact openings 712. The excess metal of the first metal layer is also removed to form a plurality of source lines 818 in the source line trenches 812 and a plurality of bit line contacts 819 in the staggered bit line contact openings 813 in the core area. In one implementation, the first metal layer is chemical-mechanical polished (CMP) to form the peripheral contacts 718, the source lines 818 and the staggered bit line contacts 819. At 620, a first etch stop layer (ESL) 720, 820 may be deposited.

Figure 6C:
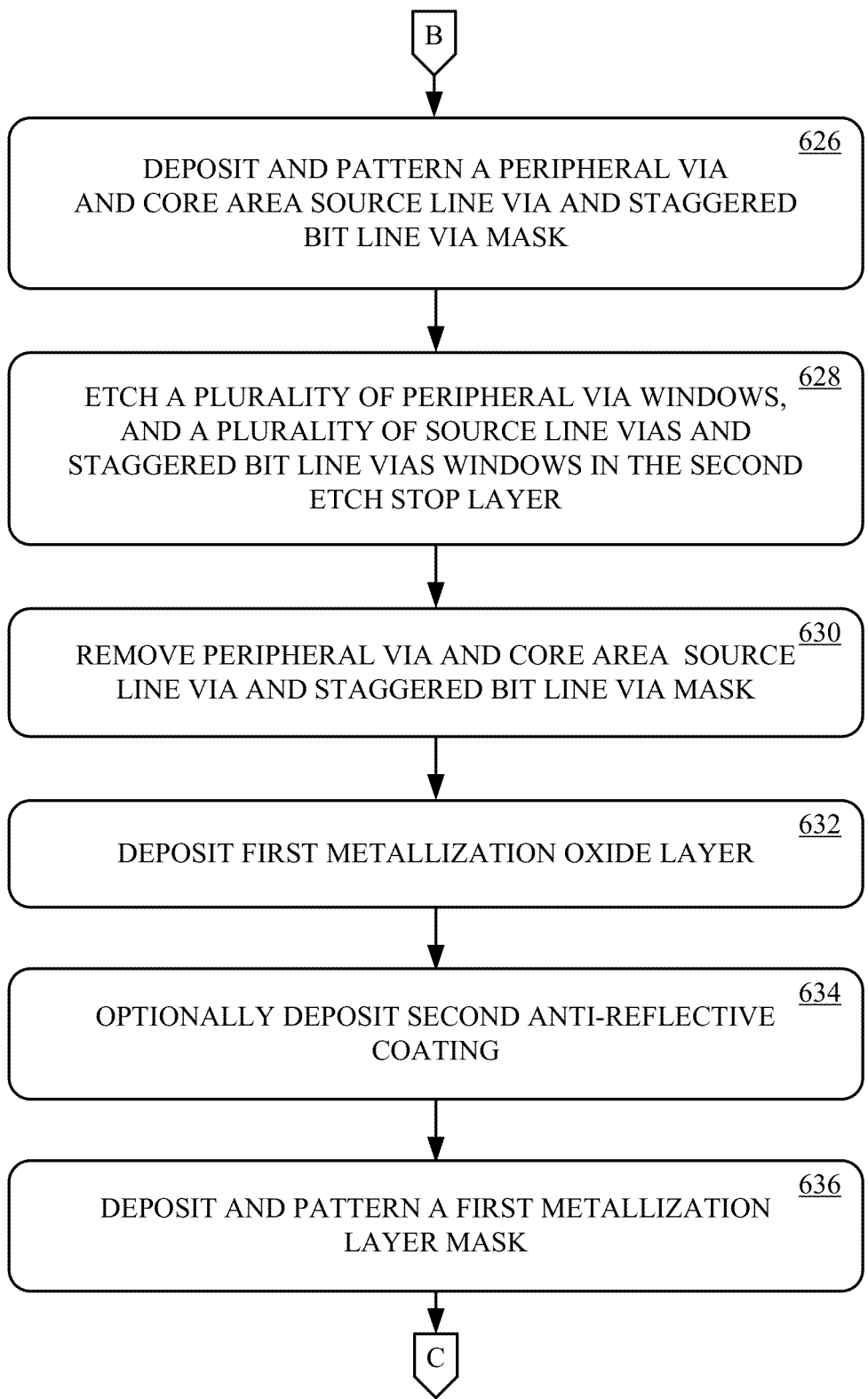
Figure 6D:
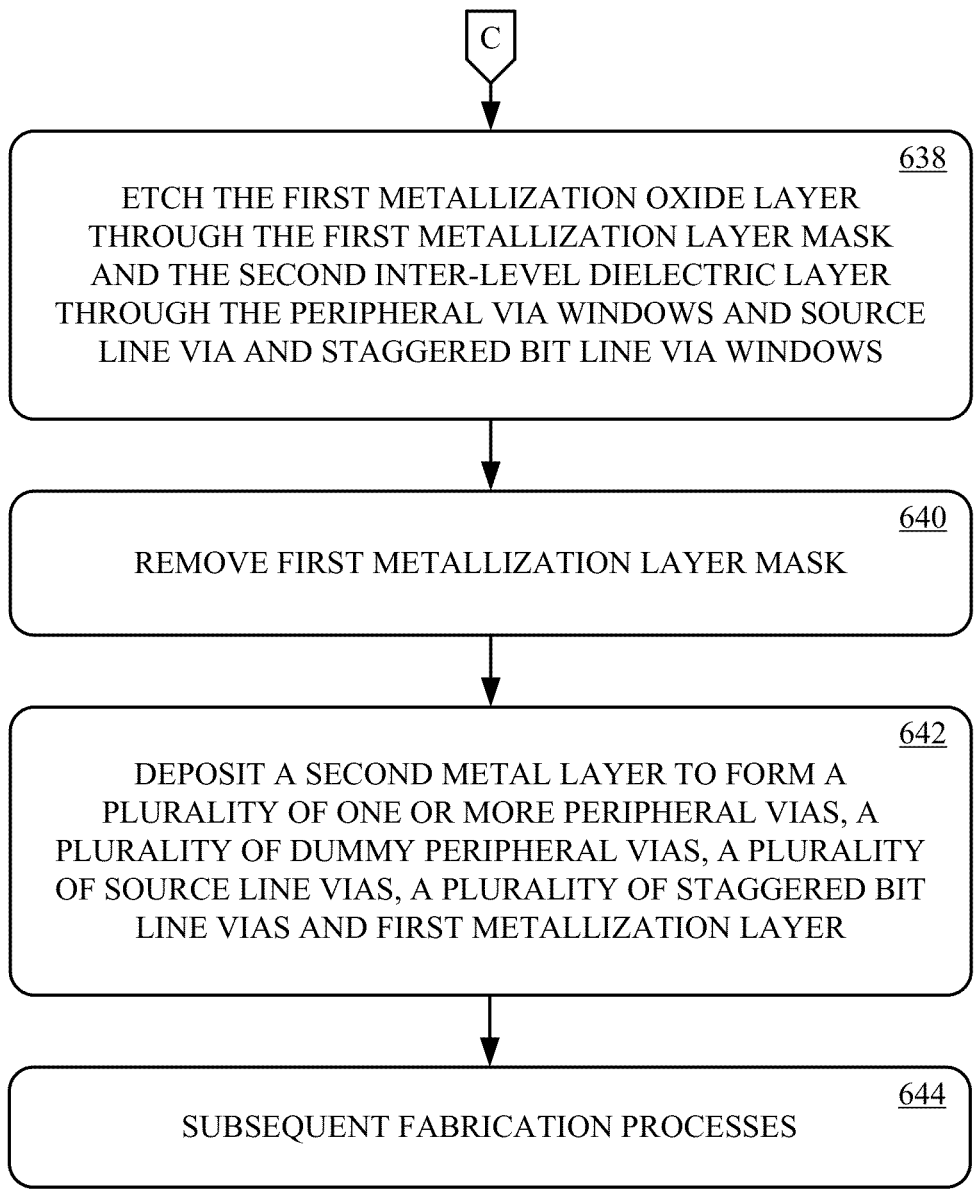
Figure 7C:
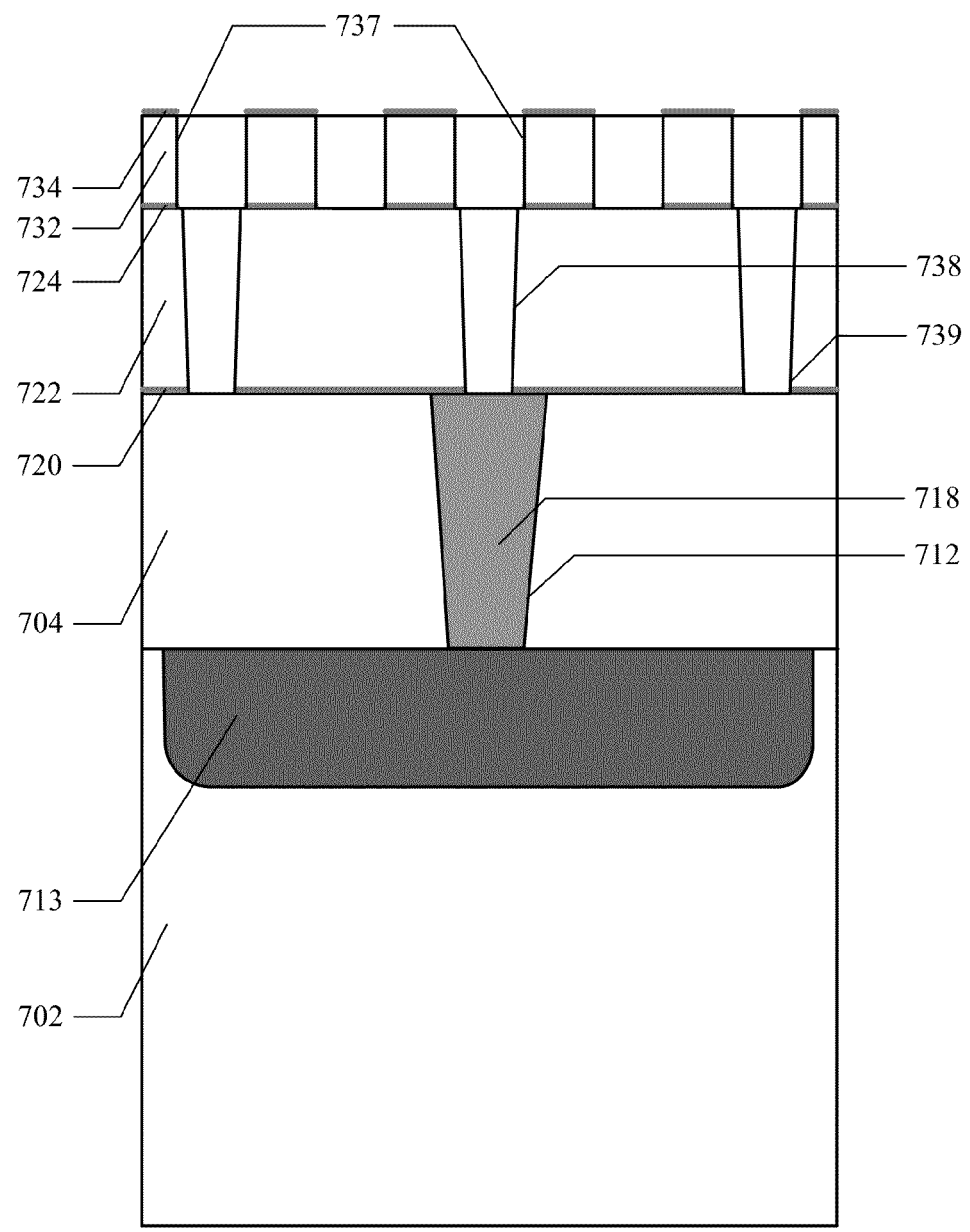
Figure 8C:
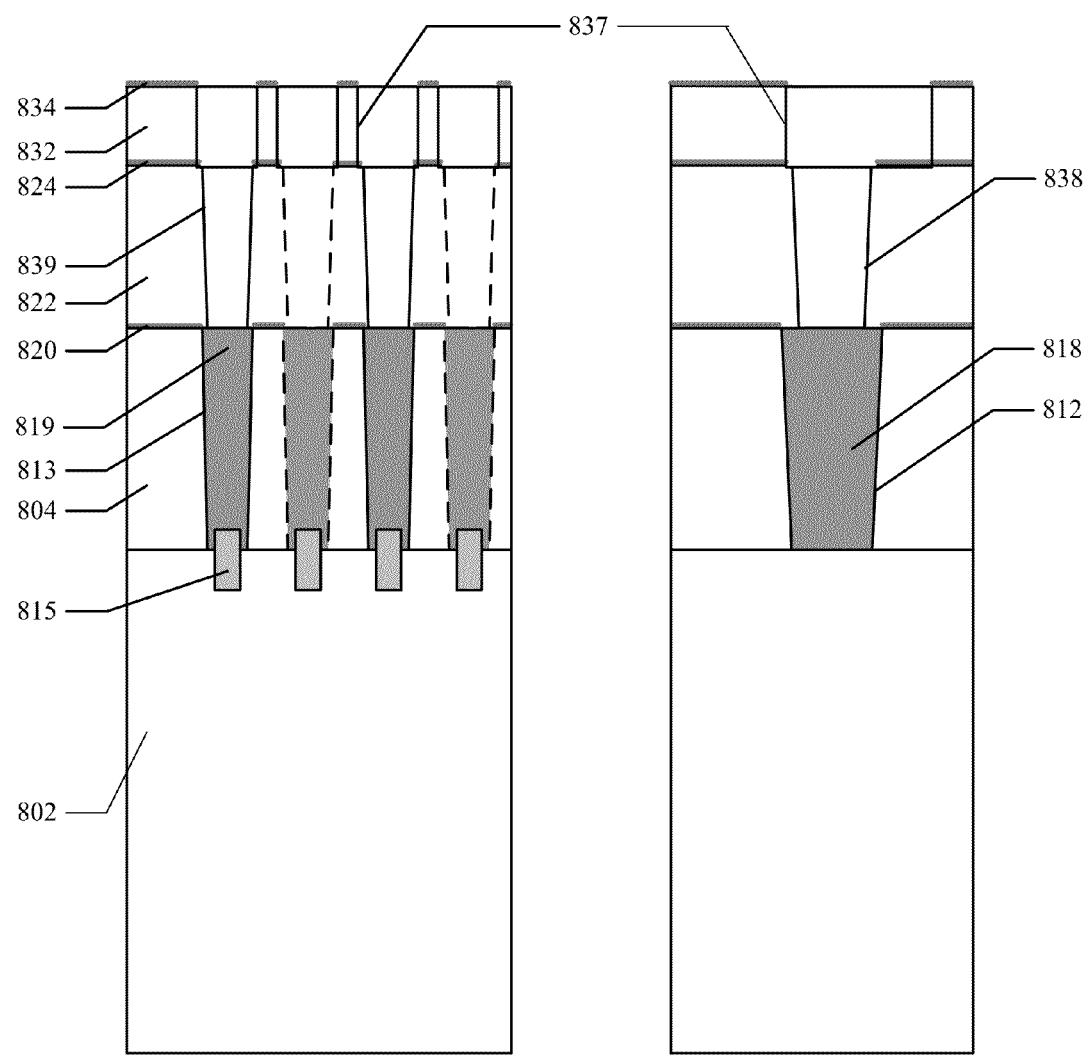

Referring now to FIGS. 7C and 8C, a second inter-level dielectric layer (ILD0B) 722, 822 is deposited, at 622. The inter-level dielectric may be chemical-vapor-deposited or sputtered silicon dioxide (SiO2), polyimide or the like. At 624, a second etch stop layer (ESL) 724, 824 may be deposited. Referring now to FIG. 6C, a photo-resist is deposited and patterned by any well-known lithography process to form a peripheral via and core area source line via and staggered bit line via mask, at 626. The pattern of the peripheral via and core area source line via and staged bit line mask includes one or more openings in registration with the peripheral contacts 718 and one or more additional openings in the peripheral area. The pattern of the peripheral via and core area source line via and staggered bit line via mask also includes openings in registrations with the source lines 819 and the bit line contacts 818 in the core area.

At 628, a plurality of openings are etched in the second etch stop layer 724, 824 by any well-known etching method to form one or more via windows in the peripheral area. A plurality of source line via windows and a plurality of staggered bit line via windows are also etched in the core area.

Figure 7D:
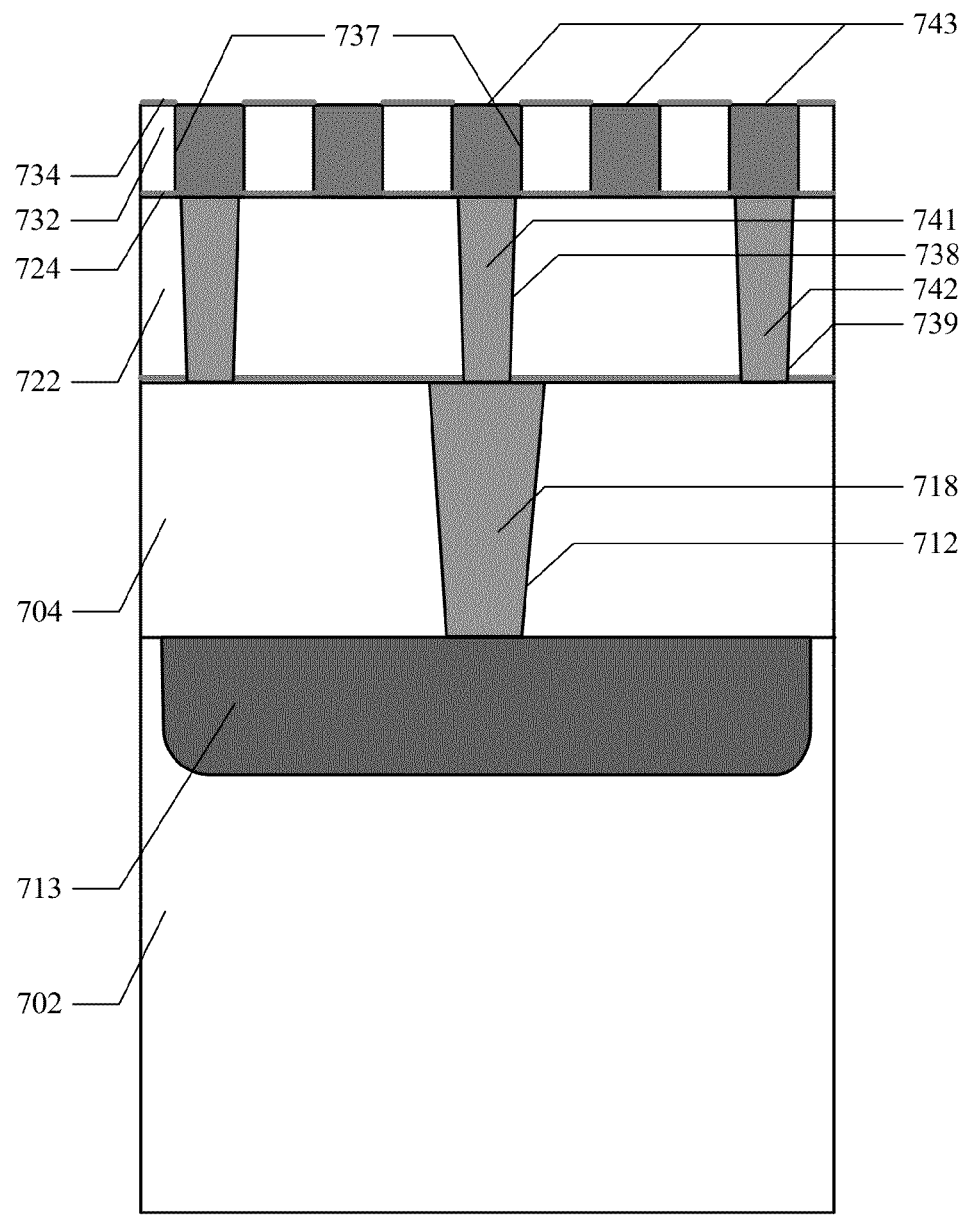
Figure 8D:
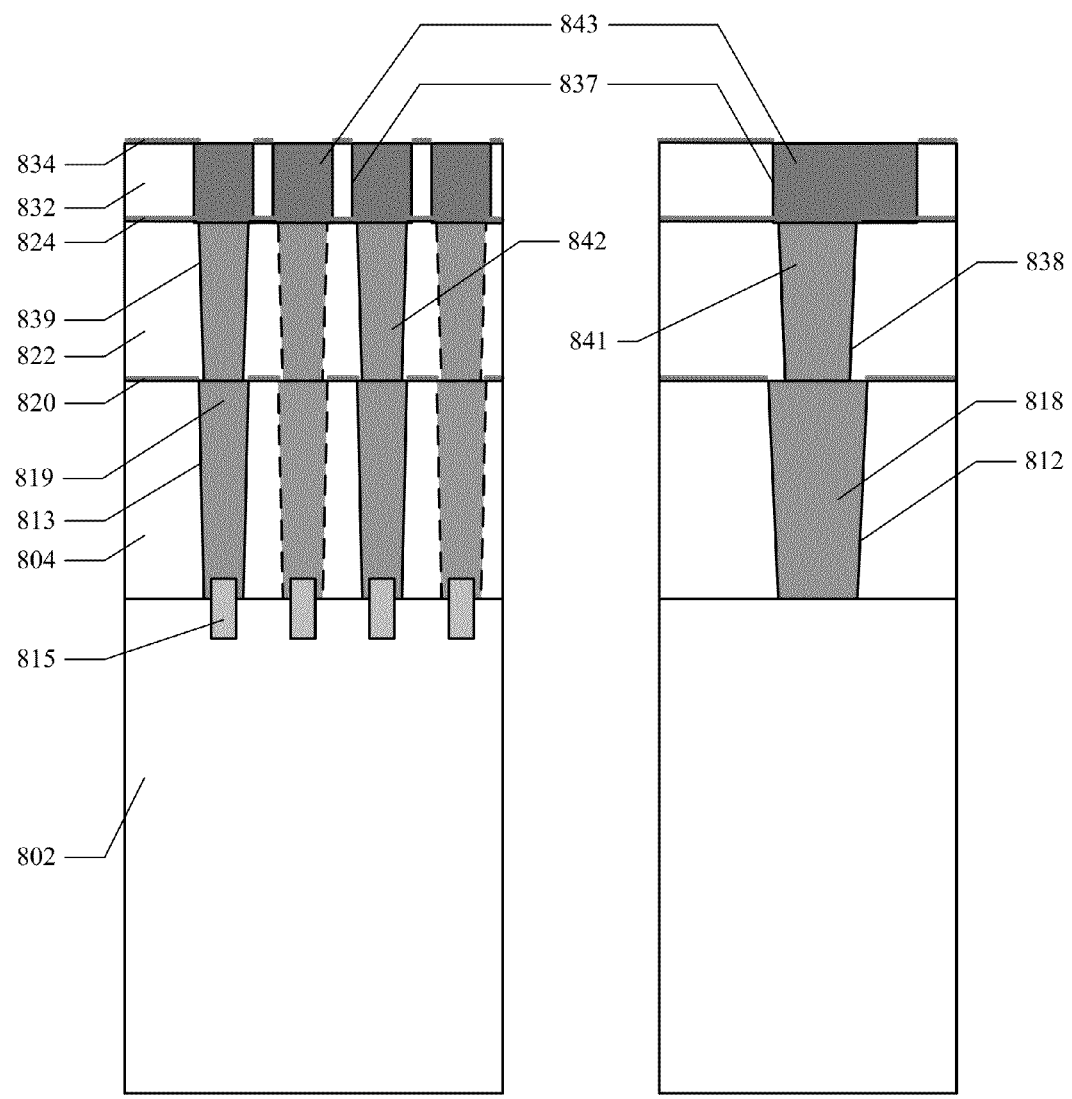

At 630, the peripheral via and core area source line via and staggered bit line via mask is removed utilizing an appropriate resist stripper or a resist ashing process. Referring now to FIGS. 7D and 8D, a first metallization oxide layer 732, 832 is deposited, at 632. At 634, a first anti-reflective coating (ARC) may also be deposited. At 636, a photo-resist is deposited and patterned by any well-known lithography process to form a first metallization layer mask. At 638, the first metallization oxide layer 732, 832 exposed by the first metallization layer mask and the second inter-level dielectric layer 722, 822 through the peripheral via windows, source line windows and bit line windows are etched by any well-known etching method. The first metallization layer 732, 832 is etched to pattern the first metallization layer 737, 837. The second inter-level dielectric layer is etched to form a one or more via openings 738 and a plurality of dummy via openings 739 in the peripheral area, and a plurality of source line via openings 838 and staggered bit line via openings 839 in the core area. Again, the aspect ration of the peripheral via openings 738 and the staggered bit line via openings 839 may be characterized by tapered walls. The staggering of the bit line via openings 839 enables use of a larger tapering for the bit line via openings 839.

At 640, the first metallization layer mask is removed utilizing an appropriate resist stripper or a resist ashing process. At 642, a second metal layer is deposited using an additive technique such as plating or the like. In one implementation, the metal may be copper (Cu), aluminum (Al), tungsten (W) or the like. The second metal layer forms one or more peripheral vias 741 and a plurality of dummy peripheral vias 742 and first metallization layer 743 in the peripheral area. The second metal layer also forms source line vias 841, staggered bit line vias 842 and first metallization layer 843 in the core area. At 644, fabrication continues with various other processes. The various processes typically include cleaning, depositing, oxidation, doping, diffusion, implanting, photolithography, etching, chemical vapor deposition, evaporation, sputtering, epitaxy, annealing, passivation, cleaving and/or the like.

It is appreciated that the staggering of the bit line vias and the tapering of the bit line vias increase the allowable alignment errors (e.g., relaxes lithography constraints) between the staggered bit line contacts 819 and staggered bit line vias 842 respectively. Similarly, the enlarged peripheral contacts 718 increase the allowable alignment errors between the peripheral contacts 718 and peripheral vias 741 respectively. In addition, the tapering of the peripheral contacts 718, peripheral vias 741, peripheral dummy vias 742, core area bit line contacts and vias 819, 842, and the source line 818 and source line vias 841 allow a more uniform fill. It is also appreciated that the dummy vias 742 improve manufacturability of the peripheral area vias 741. In addition, the peripheral area contacts 718 and vias 741, 742 may be formed at the same time as the source lines 818, source line vias 841, bit line contacts 819, and bit line vias 842 in the core area. Furthermore, the peripheral area contacts 718 and vias 741, 742, and the core area source lines 818, source line vias 841, bit line contacts 819, and bit line vias 842 may be fabricated from metal.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the Claims appended hereto and their equivalents.

What is claimed is:

1. An integrated circuit memory device comprising:
  a substrate having a peripheral area and a core area;
  a first inter-level dielectric layer disposed on the substrate;
  a second inter-level dielectric layer disposed on the first inter-level dielectric layer;
  a peripheral contact that extend through the first inter-level dielectric layer in the peripheral area;
  a peripheral via that extends through the second inter-level dielectric layer to the peripheral contact in the peripheral area;
  a plurality of peripheral dummy vias that extend through the second inter-level dielectric layer and adjacent the peripheral via in the peripheral area;
  a metallization layer wherein at least a portion is coupled to the peripheral via;
  a plurality of source lines that extend through the first inter-level dielectric layer in the core area, wherein the peripheral contact is enlarged relative to the plurality of source lines;
  a plurality of source line vias that extend through the second inter-level dielectric layer to each respective one of the plurality of source lines in the core area;
  a plurality of bit line contacts that extend through the first inter-level dielectric layer to each respective one of a plurality of bit lines in the core area;
  a plurality of bit line vias that extend through the second inter-level dielectric layer to each one of the plurality of bit line contacts in the core area; and
  the metallization layer wherein at least a second portion is coupled to one or more of the plurality of source line vias and a third portion is coupled to one or more of the plurality of bit line vias.

2. The integrated circuit memory device of claim 1, wherein the peripheral contact, the peripheral via, and the plurality of peripheral dummy vias are formed from a metal or metal alloy.

3. The integrated circuit memory device of claim 1, wherein the peripheral contact, the peripheral via, and the plurality of peripheral dummy vias are comprised of one or more metals selected from the group consisting of tungsten, titanium, and titanium nitrate.

4. The integrated circuit memory device of claim 1, wherein the peripheral contact, the peripheral via, and the plurality of peripheral dummy vias are tapered.

5. The integrated circuit memory device of claim 1, wherein the peripheral contact, the plurality of bit line contacts, and the plurality of source lines are formed from a first metal layer.

6. The integrated circuit memory device of claim 1, wherein the peripheral via, the plurality of peripheral dummy vias, the plurality of bit line vias, and the plurality of source line vias are formed from a second metal layer.

7. A device comprising:
a substrate of an integrated circuit memory device;
a first inter-level dielectric layer, on the substrate, including a contact opening;
a contact in the contact opening that extends to a component in a peripheral area of the substrate;
a second inter-level dielectric layer, on the first inter-level dielectric layer, including a via opening and a dummy via opening;
a via in the via opening that extends to the contact;
a dummy via in the dummy via opening;
the first inter-level dielectric layer further including plurality of source line trenches and a plurality of staggered bit line contact openings, wherein the contact opening in the peripheral area is enlarged relative to the plurality of source line trenches;
a plurality of source lines in the source line trenches;
a plurality of staggered bit line contacts in the staggered bit line contact openings;
the second inter-level dielectric layer further including a plurality of source line via openings and a plurality of staggered bit line via openings;
a plurality of source line vias in the plurality of source line via openings that each extend to a respective one of the plurality of source lines; and
a plurality of staggered bit line vias in the plurality of staggered bit line via openings that extend to a respective one of the plurality of staggered bit line contacts.

8. The device of claim 7, wherein the contact, the via and the dummy via are tapered.

9. The device of claim 7, further comprising:
an etch stop layer, on the second inter-level dielectric layer, including a via opening window;
a first metallization oxide layer, on the etch stop layer; including a metallization layer opening aligned with the via opening window in the etch stop layer;
a metal layer in the metallization layer opening.

10. The device of claim 7, wherein:
the contact opening is a peripheral contact opening;
the contact is a peripheral contact;
the via opening is a peripheral via opening; and
the via is a peripheral via.

11. The device of claim 10, wherein:
the peripheral contact, the plurality of source line and the plurality of staggered bit line contacts comprise a first metal layer; and
the peripheral via, the plurality of source line vias and the plurality of staggered bit line vias comprise a second metal layer.

* * * * *